US006972209B2

(12) United States Patent
Agarwala et al.

(10) Patent No.: US 6,972,209 B2
(45) Date of Patent: Dec. 6, 2005

(54) STACKED VIA-STUD WITH IMPROVED RELIABILITY IN COPPER METALLURGY

(75) Inventors: Birendra N. Agarwala, Hopewell Junction, NY (US); Conrad A. Barile, Wappingers Falls, NY (US); Hormazdyar M. Dalal, LaGrangeville, NY (US); Brett H. Engle, Hopewell Junction, NY (US); Michael Lane, Cortlandt Manor, NY (US); Ernest Levine, Poughkeepsie, NY (US); Xiao Hu Liu, Croton-on-Hudson, NY (US); Vincent McGahay, Poughkeepsie, NY (US); John F. McGrath, Somerville, MA (US); Conal E. Murray, Yorktown Heights, NY (US); Jawahar P. Nayak, Wappingers Falls, NY (US); Du B. Nguyen, Danbury, CT (US); Hazara S. Rathore, Stormville, NY (US); Thomas M. Shaw, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 10/306,534

(22) Filed: Nov. 27, 2002

(65) Prior Publication Data

US 2004/0101663 A1 May 27, 2004

(51) Int. Cl.[7] .............................................. H01L 21/00

(52) U.S. Cl. .......................... 438/52; 438/50; 438/622; 438/623; 438/638

(58) Field of Search ................................ 438/622, 623, 438/638, FOR 355, FOR 489, 50, 52

(56) References Cited

U.S. PATENT DOCUMENTS

| | | | | |
|---|---|---|---|---|
| 6,417,575 | B2 * | 7/2002 | Harada et al. | 257/784 |
| 6,500,750 | B1 * | 12/2002 | Shroff et al. | 438/622 |
| 2002/0001937 | A1 * | 1/2002 | Kikuchi et al. | 438/618 |
| 2003/0073302 | A1 * | 4/2003 | Huibers | 438/622 |

* cited by examiner

*Primary Examiner*—Michelle Estrada
(74) *Attorney, Agent, or Firm*—Scully, Scott, Murphy & Presser; Robert M. Trepp, Esq.

(57) ABSTRACT

A multilevel semiconductor integrated circuit (IC) structure including a first interconnect level including a layer of dielectric material over a semiconductor substrate, the layer of dielectric material comprising a dense material for passivating semiconductor devices and local interconnects underneath; multiple interconnect layers of dielectric material formed above the layer of dense dielectric material, each layer of dielectric material including at least a layer of low-k dielectric material; and, a set of stacked via-studs in the low-k dielectric material layers, each of said set of stacked via studs interconnecting one or more patterned conductive structures, a conductive structure including a cantilever formed in the low-k dielectric material. The dielectric layer of each of the multiple interconnection levels includes a soft low-k dielectric material, wherein the cantilever and set of stacked via-studs are integrated within the soft low-k dielectric material to increase resistance to thermal fatigue crack formation. In one embodiment, each of the set of stacked via-studs in the low-k dielectric material layers is provided with a cantilever, such that the cantilevers are interwoven by connecting a cantilever on one level to a bulk portion of the conductor line on adjacent levels of interconnection, thereby increasing flexibility of stacked via-studs between interconnection levels.

8 Claims, 10 Drawing Sheets

412
312
212
131
112
103
10
2310
2322
1311
2312
2311
431
432
2310
101
313
213
113

412
312
231
212
112
103
10
2324
1310
1321
1312
1311
431
432
1310
1322
101
313
2311
213
113

STACKED VIA-STUD WITH IMPROVED RELIABILITY IN COPPER METALLURGY

BACKGROUND OF THE INVENTION

1. Field of the Invention

The present invention relates generally to a new semiconductor process and integrated circuit structure, and more particularly, to a new process and structure which provides stacked via-studs, in multilevel interconnection wiring of semiconductor devices with high conductivity copper metallurgy and low-k dielectric, with improved mechanical stability under large thermal excursions.

2. Description of the Prior Art

In order to meet the ever increasing demand for increased device density and performance, a semiconductor technology consisting of a low-k dielectric material and an interconnection wiring of copper metallurgy, defined by a dual damascene method, is the present day choice. Because, dry air has the theoretically lowest dielectric constant of one (1), most low-k materials such as aerogels, hydrogen silsesquioxane (HSQ), fluorinated organic polymers (e.g., SiLK, a trade mark of Dow chemical Co., Midland, Mich.), among others, have high porosity and, thereby, a negligibly small mechanical strength. A schematic cross-section of the present day high performance interconnection structure is shown in FIG. 1(*a*). Such schemes generally have semiconductor devices (not shown) formed in silicon substrate 10 and locally interconnected by tungsten or polysilicon interconnection 101 which is imbedded in a passivation layer 103 of boro-phosphosilicate glass (BPSG) deposited just above the silicon substrate 10 to prevent any ionic migration into the device junctions. The high performance interconnection is formed with wirings of high conductivity metallurgies 131, 231, 331 on different levels, insulated from each other with layer 112, 212, 312 of low-k dielectric and interconnected at desired points by metal filled via-studs 132, 232, 332. In order to prevent, or to reduce, the corrosive impurity ingression into interconnection wiring structure, as well as to impart mechanical stability, at least one layer of the top most layer of interconnection wiring 431 and via stud 432 is imbedded in one or more layers 412 of previous standard insulators such as silicon oxide, e.g., deposited by the plasma enhanced chemical vapor deposition (PECVD) using silane ($SiH_4$) or tetraethylorthosilicate (TEOS) precursors. Accordingly, the present day high performance interconnection is comprised of one or more layers of high conductivity copper interconnections, imbedded in the low-k dielectric SiLK, and bounded on top and bottom by much denser layers of PECVD oxide and BPSG, respectively.

A reliability evaluation of such integrated circuit structures shown in FIG. 1(*a*) revealed excessive and premature failures due to circuit opens caused by development of cracks in the wiring upon thermal cycling. FIG. 1(*a*) shows a typical crack formed in the stacked via-stud, in this example, at the interface of via-stud 332 and interconnection wiring 331, after 1000 thermal cycles between −65° C. and 150° C. Unlike the well known circuit open problem caused by electromigration, these cracks are not current flow dependent and may occur at any location beyond the interface of via-stud 332 and interconnection wiring 331. These cracks are generated upon thermal cycling alone; further, the propensity of crack generation is much greater in stacked via-studs, as shown in FIG. 1(*a*). Stacked via-studs are essential in high circuit density interconnections to feed power directly from the bus lines on the upper most wiring level to the local interconnects of semiconductor devices on lower most wiring level. In an interconnection terminology, the stacked via-studs are comprised of alternatively stacked metal filled via studs 132, 232, and 332 and interconnect metal lines 131, 231, and 331. For the purposes of making stacked via-studs, the cross-sectional area of interconnection line segments 131, 231, 331 are made the same as the cross sectional areas of corresponding via-studs 132, 232, 332. One, or a set of redundant, stacked via-studs provide a direct connection from the top most level to the lower most level of interconnection. The greater the ratio of stacked via-stud height (H) to diameter of the via-studs (D), the greater is the propensity for crack formation. The continuing trend of dimensional shrinkage (smaller D) and increased wiring levels (larger H) in multilevel interconnections lead to much higher H to D ratios, thereby making the stacked via-studs of present and future interconnection wiring schemes increasingly more prone to cracks. It should be emphasized that propensity of crack formation is much less in an interconnection scheme where the porous dielectric material (e.g., SiLK) is replaced by the previous standard dense dielectric material (e.g., PECVD oxide). The crack propensity also increases with the range of temperature cycles and the number of cycles, showing that cracks are generated by metal fatigue, a phenomenon not seen before in integrated circuit wiring. During thermal cycling of the substrate, the stacked via-stud undergoes compressive/tensile stresses generated, respectively, by thermal expansion/contraction of the stacked via-stud due to mismatch in coefficients of thermal expansion between the metal and the surrounding dielectric. Because the stacked via-stud is mechanically pinned by the relatively much denser, and stiffer, layer of PECVD oxide at the top, and by the silicon substrate at the bottom, the difference in thermal expansion/contraction between the metal and the surrounding dielectric causes the stresses in the stacked via-stud. It should be noted that the thermal coefficient of expansion mismatch between copper and SiLK is several times higher than that between copper and PECVD oxide, thereby making the stacked via-stud of copper and low-k dielectric, e.g., SiLK, interconnection wiring scheme much more prone to crack formation than in stacked via-studs of present day multilevel interconnections comprised of a dense dielectric, e.g., PECVD oxide, at all levels of the interconnection. The crack formation in copper-SiLK interconnection wiring scheme is further aggravated due to nearly absent compressive stresses in SiLK dielectric material. Fatigue crack initiation is a surface phenomenon; it is well known that a surface coating improves the fatigue life. Dense oxide films, in deposited thin film form, have high intrinsic compressive stress, thereby exerting a lateral compressive force on via-studs. These compressive forces on the via-stud surface help delaying, or preventing, the thermal fatigue failure in present day wiring schemes with a dense dielectric, e.g., PECVD oxide, material. The negligibly small compressive stress in low-k materials, along with the large thermal expansion mismatch between copper and low-k dielectric, e.g., SiLK, are root causes for the observed fatigue failure.

One of the major applications of stacked via-studs is to directly transfer large amount of current from power buses on the top most level of interconnection wiring to power buses on lower levels. Invariably, a scheme of redundant stacked via-studs is used to carry a large amount of current. FIG. 1(*b*) shows a perspective view of a set of four redundant stacked via-studs in present day technology, formed between fat metal lines of power buses on different layers of interconnection wiring. In such cases, the propensity of fatigue crack formation is greatly increased in multilevel interconnection schemes with low-k dielectric, e.g. SiLK, due to additional compressive stresses arising from the rigidity of fat metal lines acting on the stacked via-stud column.

Accordingly, methods must be sought to mechanically strengthen the tall, thin stacked via-stud structures imbedded in a soft low-k dielectric material.

U.S. Pat. No. 6,143,396 to Saran, the disclosure of which is incorporated by reference herein, provides an architecture of reinforced wire bond pads to prevent cracking of pads during mechanical loading, such as electrical testing, wire bonding or solder ball joining. A multiple of metal studs underneath bond pads are provided to make the bond pads more mechanically stable.

U.S. Pat. No. 6,232,662 B1 to Saran, the disclosure of which is incorporated by reference herein, enhances the architecture in his earlier patent by interconnecting the reinforcing metal studs and adding a layer of metal wiring, such that the reinforcing metal studs form a part of an active interconnection pattern and, thereby, the real estate underneath the bond pads is conserved. All of Saran's schemes involve short length metal studs bounded on top and bottom by a dense dielectric material; such schemes are not beneficial when the studs are long, for example, in the case of stacked via-studs as discussed above.

Bearing in mind the problems and deficiencies of the prior art, it would be beneficial to provide a semiconductor device having copper interconnections and low strength low-k dielectric with a stacked via-stud which is resistant to cracking upon large thermal excursions.

SUMMARY OF THE INVENTION

It is therefore an object of the present invention to provide a semiconductor device having copper interconnections and low strength low-k dielectric with a stacked via-stud which is resistant to cracking upon large thermal excursions.

It is a further object of the present invention to provide a semiconductor device having copper interconnections and low strength low-k dielectric with a stacked via-stud that is mechanically flexible at top end of the stack.

It is another object of the present invention to provide a semiconductor device having copper interconnections and low strength low-k dielectric with a stacked via-stud that is mechanically flexible.

It is yet another object of the present invention to provide a semiconductor device having copper interconnections and low strength low-k dielectric with a stacked via-stud that includes at least one cantilever structure, integrated with the stacked via-stud, to allow the mechanical flexibility.

It is still another object of the present invention to provide a semiconductor device having copper interconnections and low strength low-k dielectric with a stacked via-stud that provides at least one stacked via-stud with more than one integrated cantilever structure, where each of the provided cantilevers is formed on a different level of the interconnection wiring scheme.

It is a further object of the present invention to provide a semiconductor device having copper interconnections and low strength low-k dielectric with a stacked via-stud that includes a set of redundant stacked via-studs where each stack is provided with at least one integrated cantilever structure, and interwoven to conserve wiring real estate.

Thus, according to a first aspect of the present invention, there is provided, a multilevel semiconductor integrated circuit (IC) structure and process method for forming. The structure comprises:

a semiconductor substrate layer having formed therein a metal feature, a first interconnect layer including low-k dielectric material formed over the substrate;

a first via stud in the first interconnect dielectric layer connecting the metal feature formed in the semiconductor substrate to a first metal interconnection line segment formed in the first dielectric layer;

a second interconnect layer including low-k dielectric material formed over the first interconnect dielectric layer;

a second via stud in the second interconnect dielectric layer aligned with and connecting the first metal interconnection line segment with a second metal interconnection line segment formed in the second dielectric layer, the second metal interconnection line segment of rectangular shape and at a selected location such that one end of the second metal line segment is above the first metal line segment of the same length and the width;

a third interconnect layer including low-k dielectric material formed over the second interconnect dielectric layer; and, a third via stud in the third interconnect dielectric layer connecting the second metal interconnection line segment of rectangular shape at an opposite end thereof with a third metal interconnection line segment formed in the third dielectric layer, the first, second and third integrated via-studs and the second metal line segment forming a stacked via-stud arrangement with the second metal line segment comprising a cantilever structure.

Preferably, a dielectric material of each the first, second and third interconnection dielectric layers includes a soft low-k dielectric material, the cantilever being integrated within the soft low-k dielectric material at a level to increase resistance to thermal fatigue crack formation.

According to a second aspect of the present invention, there is provided a multilevel semiconductor integrated circuit (IC) structure and process method for forming. The structure comprises:

a first interconnect level including a layer of dielectric material over a semiconductor substrate, the layer of dielectric material comprising a dense material for passivating semiconductor devices and local interconnects underneath;

multiple interconnect layers of dielectric material formed above the layer of dense dielectric material, each layer of dielectric material including at least a layer of low-k dielectric material; and, a set of stacked via-studs in the low-k dielectric material layers, each of the set of stacked via studs interconnecting one or more patterned conductive structures, a conductive structure comprising a cantilever formed in the low-k dielectric material.

Preferably, the cantilever comprises a high conductivity metal and is disposed between two stacks of via-studs from the set of stacked via-studs.

According to a third aspect of the present invention, there is provided a redundant system for interconnecting conductive layers of a multiple layer semiconductor integrated circuit (IC), the redundant system comprising:

a plurality of interlaced metal via-studs for interconnecting a first conductive structure at a lower level interconnect structure lying over a substrate to a second conductive structure formed in an upper interconnect level, each the conductive structures lying in a layer of dielectric material;

a third conductive structure in an interconnect level between the lower and upper interconnect levels, the interconnect level including a low-k dielectric material, at least one of the metal via-studs connecting the first conductive structure to the third conductor structure at a bulkhead region end of the third conductive structure;

a gap being formed in the third conductive structure to result in one or more cantilever structures in the third conductive structure; and, one of the metal via-studs connecting a free end of the cantilever structure a distance from the other at least one metal via-stud to a bulkhead region formed in the second conductive structure at the upper level.

In this third embodiment, the third conductive structure lies in a perpendicular fashion with respect to the upper and lower conductive structures to facilitate redundant paths connecting the first and second conductive layers via the third conductive layer. Furthermore, the second conductive layer includes a further cantilever structure, the cantilever structures of the second and third conductive structures being interwoven by connecting a cantilever on one conductive structure at a level of interconnection to a bulk portion of a conductive structure on an adjacent level of interconnection, thereby increasing flexibility of stacked via-studs between interconnection levels.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1(*b*) is a perspective view of a set of four redundant stacked via-studs in present day art.

DETAILED DESCRIPTION OF THE INVENTION

The present invention is generally related to methods for forming metal filled via-studs and conductor lines on a substrate where the via-studs and conductor lines are formed using a dual damascene method, and preferably copper metallurgy and low-k dielectric material. The present invention has particular relevance to stacked via-stud schemes which particularly use low strength low-k dielectric materials and incorporate a cantilever structure within the stacked via-stud which may serve as an effective thermal fatigue crack stop.

Figure 1A:
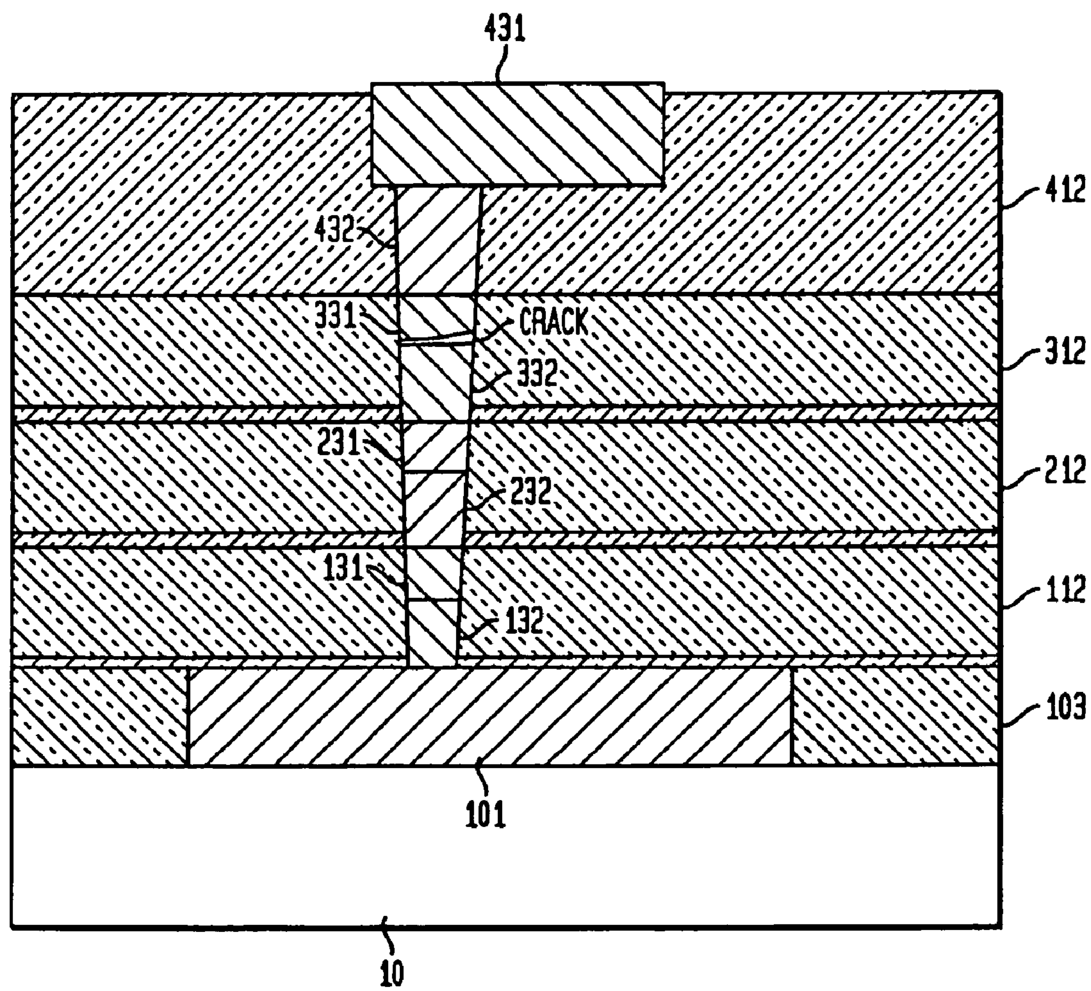
FIG. 1(*a*) is a cross-sectional side view of a prior art semiconductor device showing a fatigue crack, formed upon thermal cycling, in a stacked via-stud of copper metallurgy in SiLK low-k material.
Figure 1B:
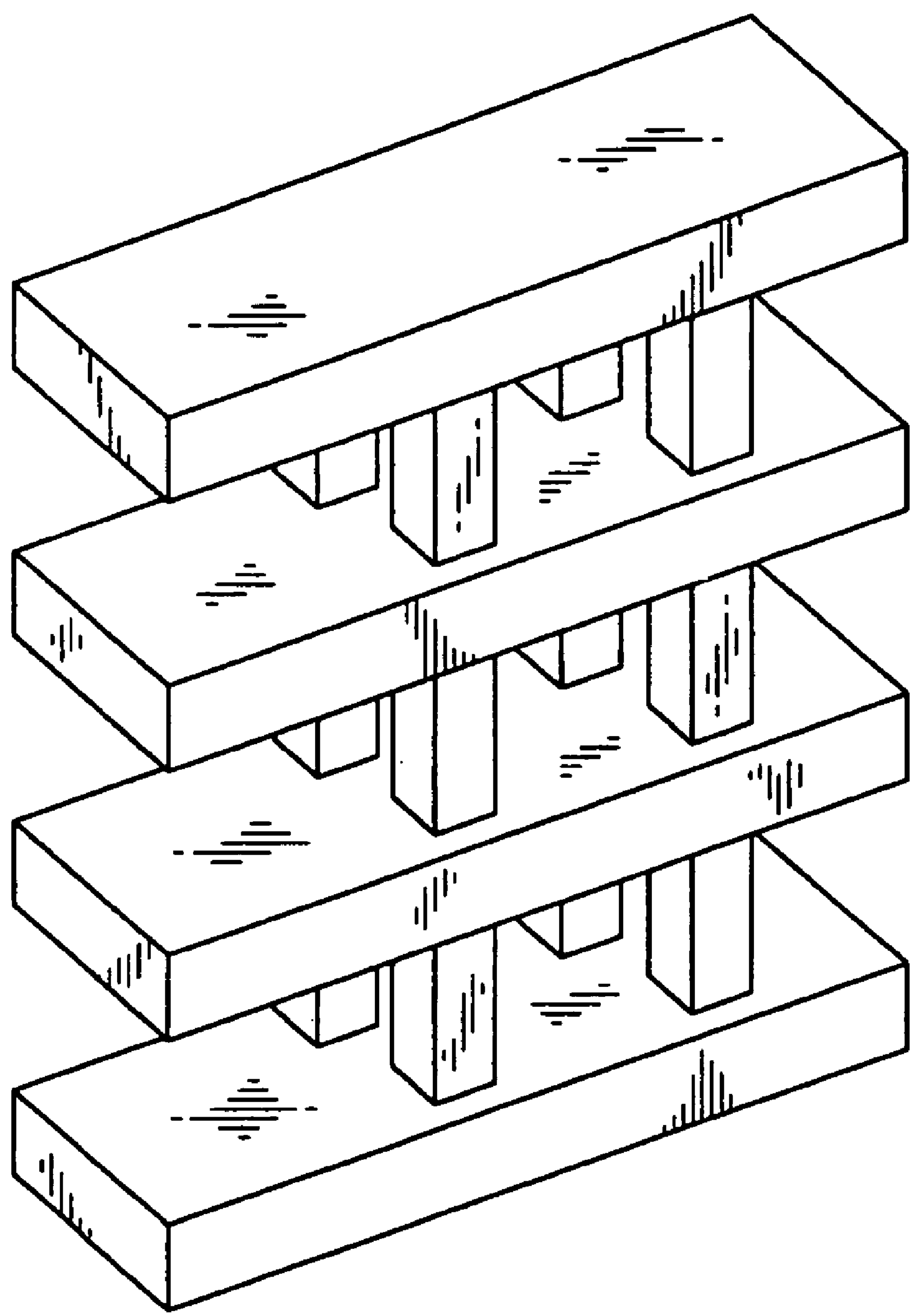
Figure 2:
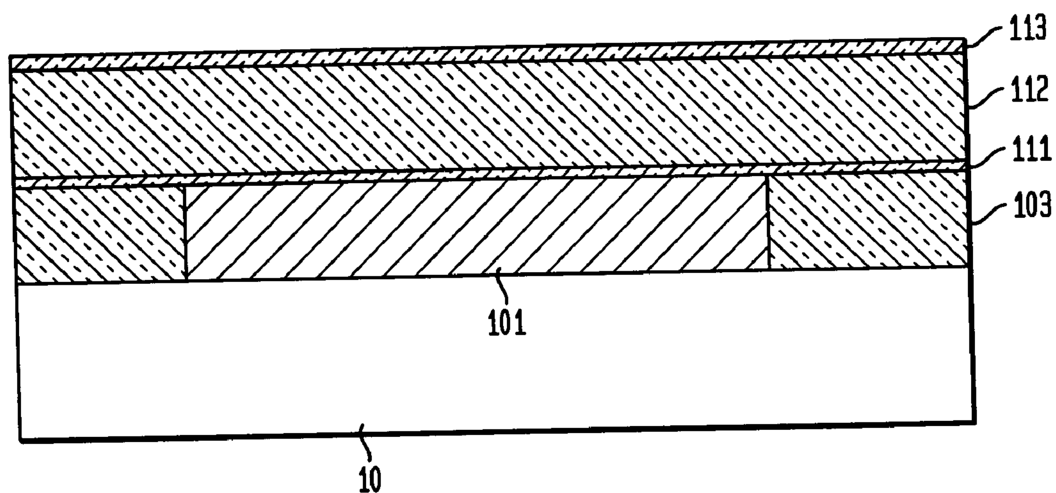
FIGS. 2 through 5 are sequential partial cross-sectional side views of a semiconductor substrate illustrating one embodiment of the present invention where one cantilever is provided.

Particularly referring to FIG. 2, there is shown a semiconductor substrate 10 above which a sequence of dielectric layers 111, 112, 113 is deposited, subsequently patterned and metallized to form a first level of interconnection. It should be understood that a plurality of semiconductor devices may be formed in the substrate and, although not shown, are provided with a local interconnect line 101, typically tungsten with underlayers of titanium and titanium nitride (not shown). The semiconductor devices and the local interconnects are provided with a passivation layer 103, typically deposited boro-phosphosilicate (BPSG) glass or like dense doped silicate glass.

The dielectric layers 111, 112, 113 comprise a bottom dielectric layer 111 of approximate thickness 20 to 50 nm, which may be PECVD deposited silicon nitride ($Si_3N_4$) or the like, a thicker low-k dielectric layer 112, and a top dielectric layer 113 of a hard mask layer of approximate thickness 20 to 90 nm, e.g., BLOk® or BLOk® and silicon nitride, to act as a moisture barrier. BLOk® (trademark of Applied Materials Inc.) is a PECVD deposited silicon carbide film. Layer 112 is a low-k dielectric material which may be deposited by any of number of well known techniques such as sputtering, spin-on, or PECVD. Preferably, the low-k dielectric layer 112 is spun-on SiLK.

Figure 3:
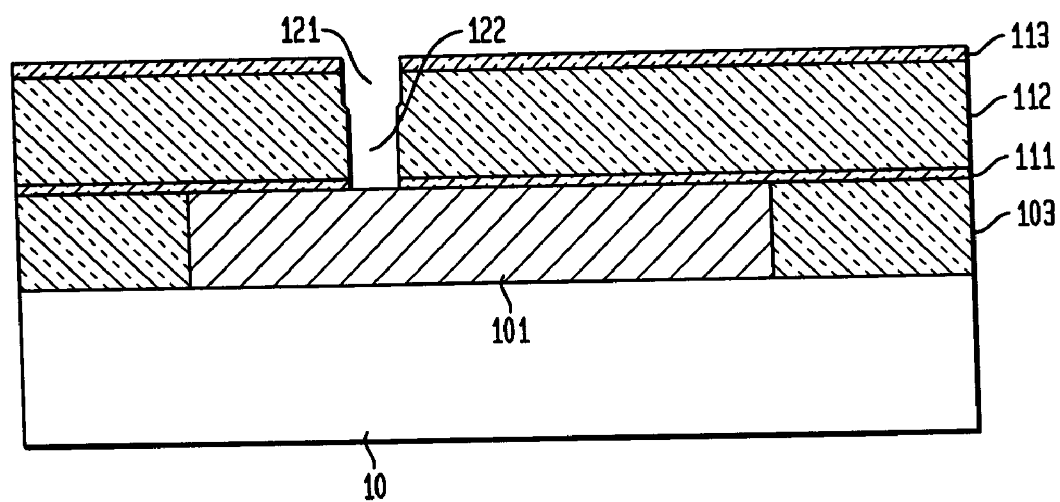

Referring to FIG. 3, a via-stud pattern is defined atop layer 113 followed by sequential etching of hard mask layer 113 and partially etching low-k dielectric 112 with suitable conventional etchants. The pattern for the high conductivity metal interconnection lines is next defined followed by further etching of hard mask 113, the remainder of low-k dielectric 112, and bottom dielectric 111 to form trenches 121 (for interconnection lines) and holes 122 (for via-studs) to expose metal line 101. For the purposes of forming a stacked via-stud, the cross-sectional area of metal line 121 is made approximately same as the cross sectional area of via-stud 122.

Figure 4:
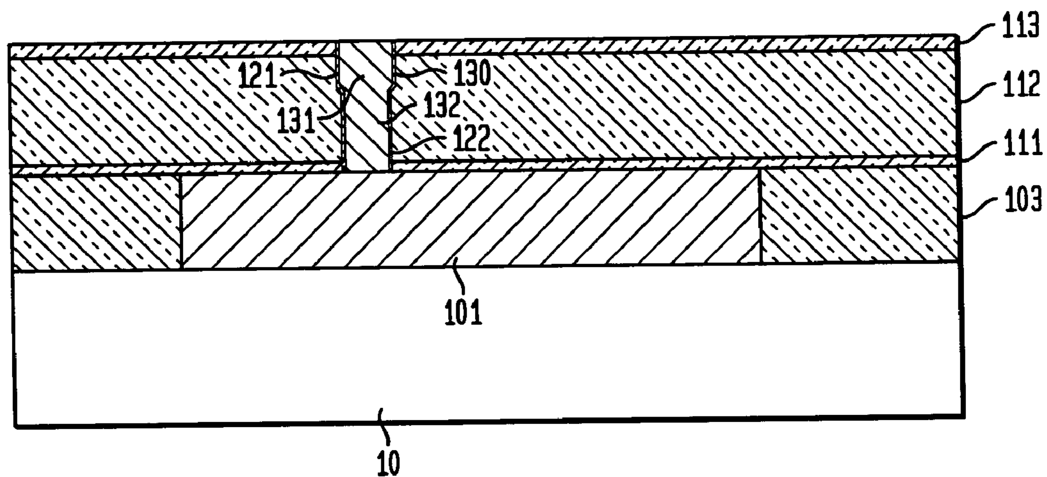

Referring to FIG. 4, a sequence of metal liner layers 130 is next deposited to line the etched trench and via-stud hole 121, 122. The metal liner layers 130 comprise refractory materials tantalum, tantalum nitride, chromium/chromium oxide, titanium, titanium nitride, tungsten, tungsten silicide, or the like, and a seed layer of copper deposited using any of the known deposition methods, such as, for example, CVD, hollow cathode magnetron sputtering, deposit-etch (dep.-etch) process, or any combination of these or, other similar methods. The liner deposition process is preferably a hollow cathode magnetron sputtering combined with dep.-etch process. This is followed by deposition of high conductivity metal such as copper for via-studs 132 and interconnection lines 131 using electroplating methods. For certain applications it may be advantageous to follow the copper deposition by deposition of a refractory metal (not shown), particularly using a CVD process, to act as a polish stop and to prevent copper corrosion. Any excess metal materials are next removed in a singular step or in a sequence of steps, such as, by chem.-mechanical polishing (CMP) to leave the integrated via-studs 132 and the interconnection lines 131, imbedded in, and substantially planar with, the surrounding low-k dielectric 112 and BLOk® layer 113, as shown in FIG. 4. The foregoing steps are initial process steps of the method conventionally known in the art as a dual damascene method.

Figure 5:
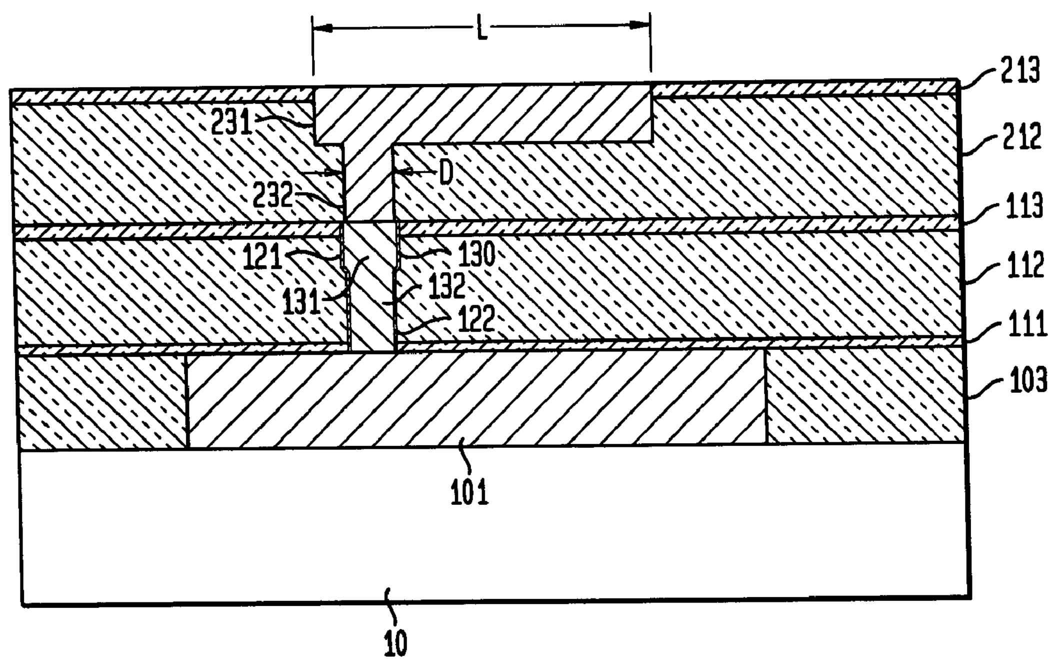

Next, a second level of combined via-stud and interconnection line segment are formed at the point in the process. Referring to FIG. 5, there is first formed the sequential deposition of dielectric layers 212 and 213, the dielectric layer 212 comprising a low-k dielectric material and a dielectric layer 213 of a denser dielectric material formed above layer 212. It should be understood that the material of the low-k dielectric layer 212 in the second level may be the same low-k dielectric material or different than the low-k dielectric material in the first layer. Then, there is formed the second level of interconnection comprised of via-stud 232 and interconnection line segment 231, where the line segment 231 is designed to be a rectangle in shape such that, the width of the rectangle is approximately the same as the diameter 'D' of the corresponding via stud 232, and the length 'L' of the rectangle is at least three times the width. Preferably, the length of the rectangle line segment 'L' is four to eight times its width. Thus, the via-stud 232 is situated at one end of the rectangular line segment 231. It should be noted that according to conventions known in the art, the line segment 231 would have been of same cross-sectional area as that of the corresponding via-stud 232.

Figure 6:
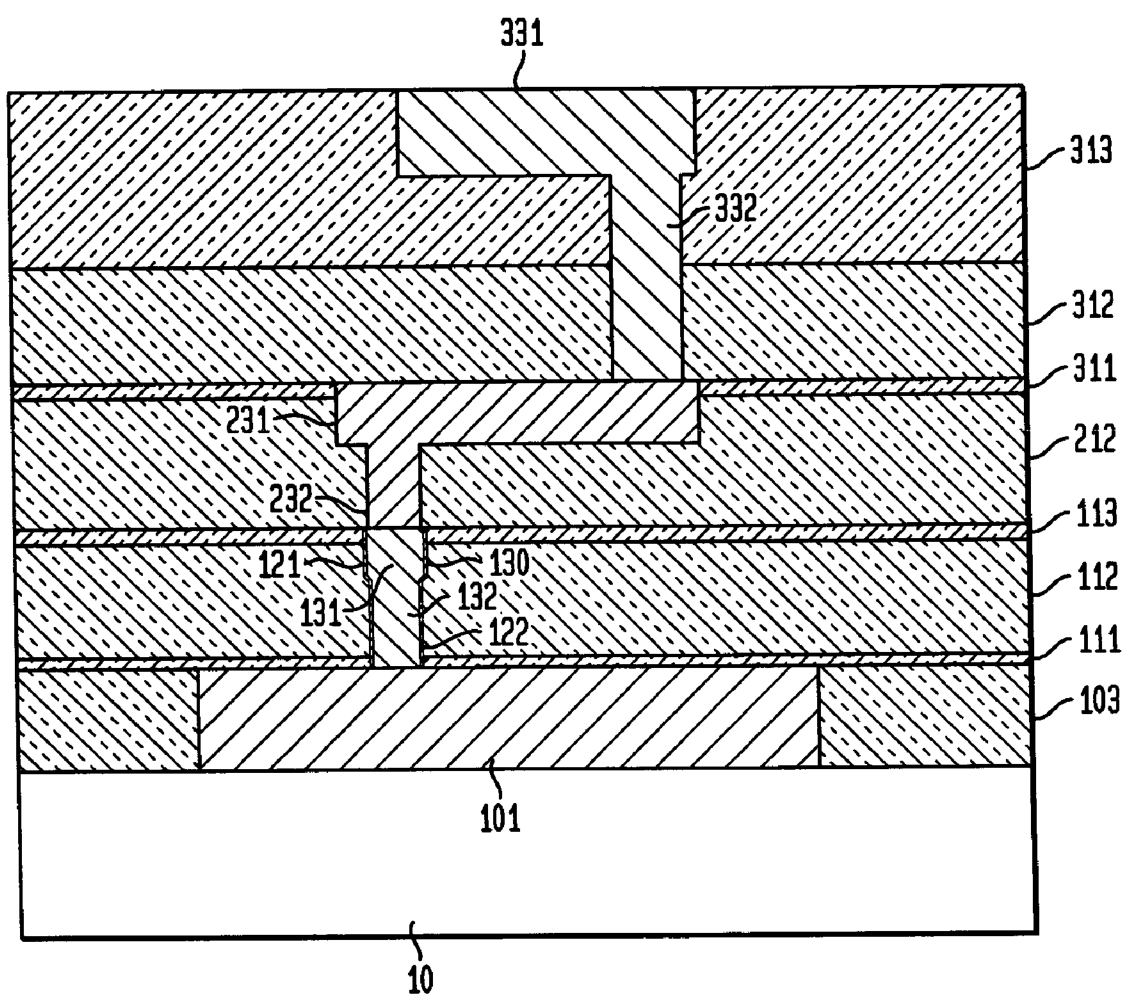
FIG. 6 is a schematic cross-section through a stacked via-stud, of present invention, containing a cantilever.

Referring to FIG. 6, dielectric layers 311, 312 and 313 are next sequentially deposited to form the last level of interconnection. The layer 311 is PECVD silicon nitride of thickness ranging from 20 to 50 nm; layer 312 is a dielectric material of porous texture, like SiLK or fluorosilicate glass (FSG), of thickness ranging from 50 nm to 500 nm; and layer 313 is a dense dielectric, such as PECVD silicon oxide or polyimide, of thickness ranging from 50 nm to 500 nm which forms the final passivation layer. It should be noted that the purpose of adding a layer 312 of porous material, like SiLK, is to provide cushioning to the stacked via-stud 231-232-131-132. The last interconnection level, comprised of via-stud 332 and interconnection line segment 331, is next formed, as above, by the dual damascene method. The via-stud 332 is designed to align with the other end of the rectangle line segment 231. The last interconnection level, comprised of via-stud 332 and interconnection line 331 is imbedded in, and substantially planar with, the dense dielectric layer 313. It should be noted that the stacked via-stud 132-131-232-231-332-331 now has an integrated cantilever 231 and a layer of soft material 312 above and below the end of the stacked via-stud as noted above. The integrated cantilever 231, having a soft material above and below it, is able to move up or down with least resistance; effectively reducing any strain induced in the stacked via-stud and preventing thermal fatigue cracking of the stacked via-stud.

Figure 7:
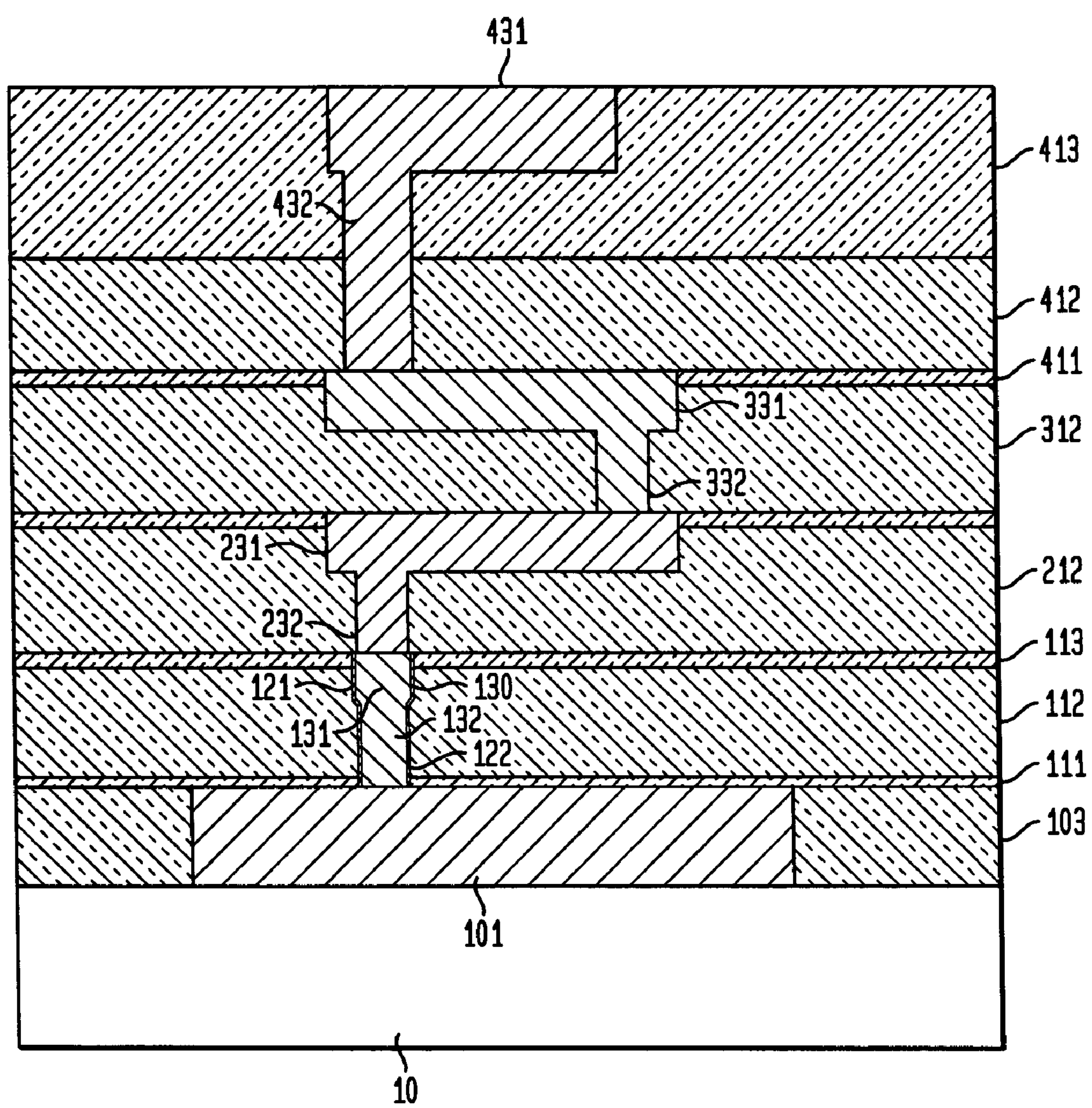
FIG. 7 is a schematic cross-section through a stacked via-stud containing two cantilevers.

FIG. 7 illustrates another embodiment of the present invention. As shown in FIG. 7, there is depicted a schematic cross-section through stacked via-studs and interconnection wiring layers, where the interconnection wiring is comprised of at least three levels in soft dielectric SiLK. Here, cantilevers 231 and 331 are provided to a stacked via-stud, where each of the cantilevers is formed on a different level of the wiring scheme. Such increased robustness becomes of increasing importance as the stud diameter decreases below 0.1 micron. Thus, as shown in FIG. 7, implementing the processes described herein, dielectric layers 411, 412 and passivation layer 413 are sequentially formed on top of the interconnect layer comprising cantilever 331. Using the processes as described herein, via-stud 432 is formed through a damascene method through dielectric layer 412 to connect with the cantilever 331 on a side of the cantilever opposite the location of the underlying via-stud 332 connection. Finally, a top level interconnect 431 is formed in layer 413.

In yet another embodiment of the present invention, an array of four redundant stacked via-studs is provided with cantilevers to increase the flexibility between fat bus lines on adjacent wiring levels. The progress of making the interwoven stacked via-stud of the present invention is sequentially shown in FIGS. 8 to 11.

Figure 8:
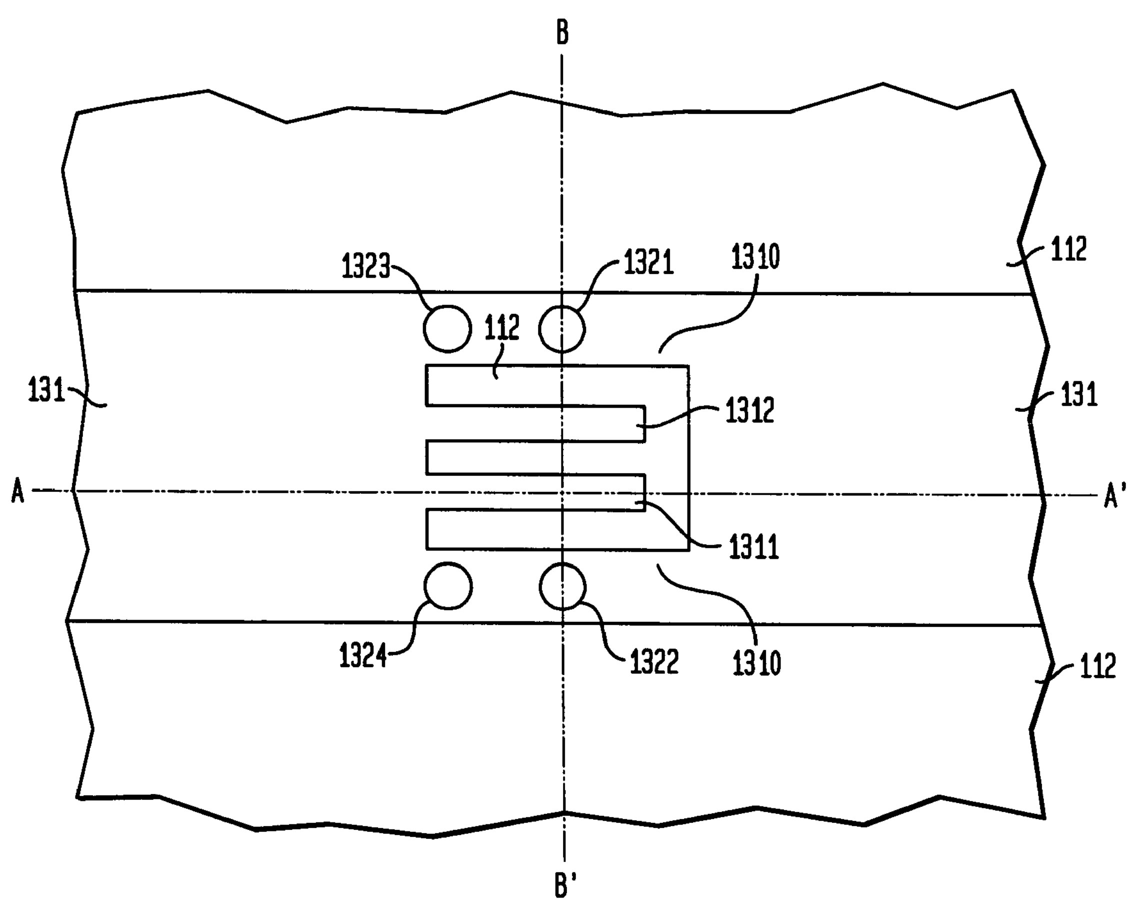
FIG. 8 is a planar top view of a portion of first level of high conductivity metal interconnection in low-k dielectric, SiLK.

FIG. 8 particularly illustrates a planar top view of a portion of first level of high conductivity interconnection. The first level of interconnection, imbedded in low-k dielectric 112, is comprised of metal lines 131 and via-studs **132*x* (where, x is 1,2,3 or 4, representing four redundant via-studs according to this embodiment). The bus line 131 is designed to provide two cantilevers, 1311 and 1312. Thus, a portion of bus lines on each level of interconnection has two cantilever structures, 1311 and 1312, and bulkheads (the remaining width of the bus line 131) 1310. It should be noted that different numerals, 1310, 1311 and 1312, are used merely to indicate various associated sections formed in the bus line 131. It should also be noted that different via-stud numerals, 1321, 1322, 1323 and 1324, indicate four particular via-studs, of via-stud family 132*x*, which make contact to local interconnections 101** on lower level of wiring (not shown).

Figure 9:
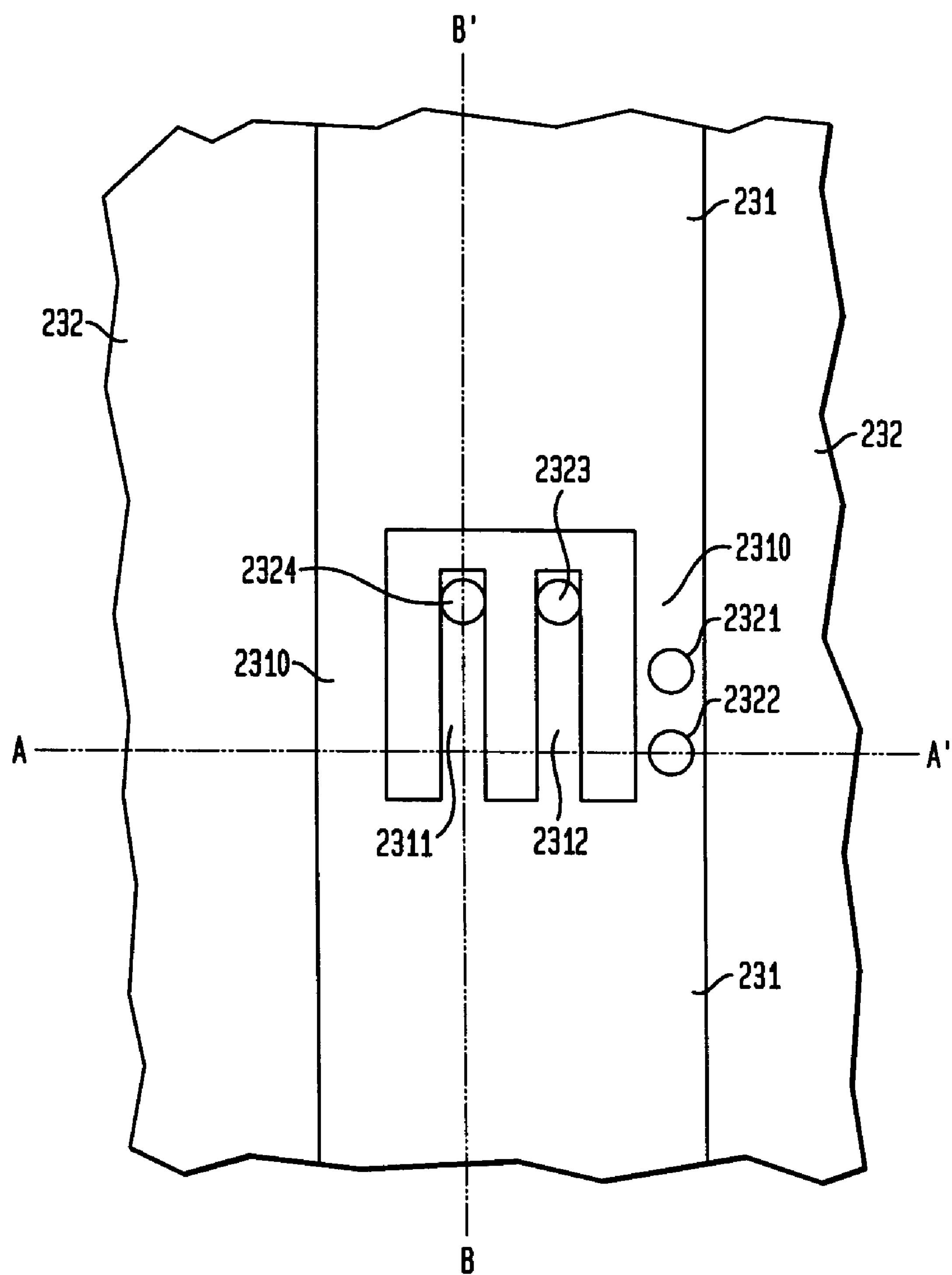
FIG. 9 is a top planar view of a portion of second level of high conductivity metal interconnection atop the same portion as in FIG. 8.
Figure 10:
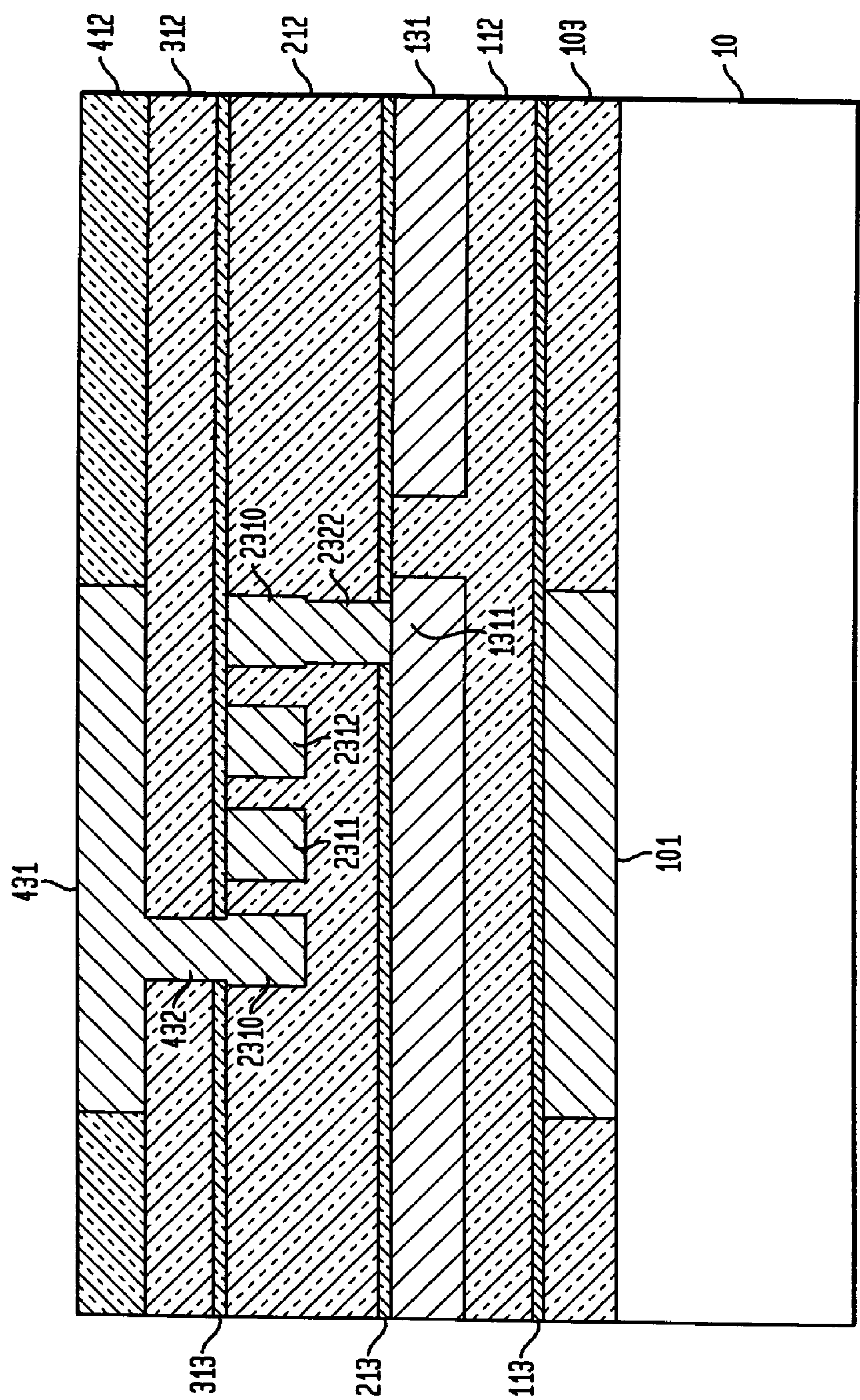
FIG. 10 is a cross-sectional view of a set of stacked via-studs at section A–A' of drawings in FIGS. 8 and 9.
Figure 11:
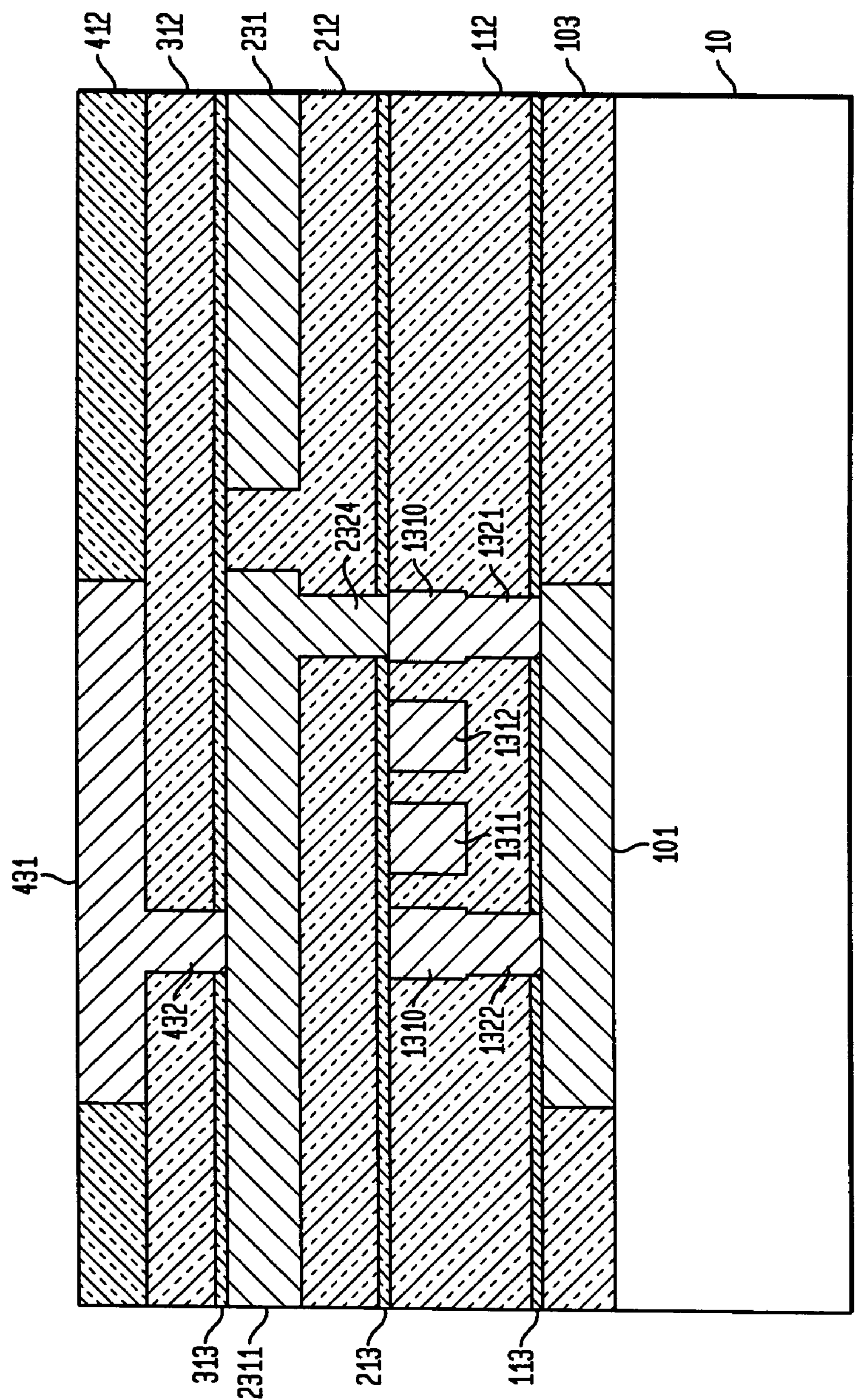
FIG. 11 is a cross-sectional view of a set of stacked via-studs at section B–B' of drawings in FIGS. 8 and 9.

FIG. 9 illustrates a planar view of a portion of the next level of wiring, where the bus lines 231 run in a direction perpendicular to the direction of bus lines 131 of the previous level. Two cantilevers, 2311 and 2312, are provided in the bus line 231. The four redundant via-studs, 2321, 2322, 2323 and 2324, formed with this level of interconnection, are selectively situated such that two of the via-studs, 2321 and 2322, connect the bulk head 2310 to the free end of cantilevers 1312 and 1311, respectively, of the previous level (FIG. 8). The other two studs 2323 and 2324 connect the end of cantilevers 2312 and 2311, respectively, to bulk head 1310 of the bus line 131 of previous level. This is more clearly illustrated in FIG. 10 which depicts a cross-sectional view of a set of stacked via-studs at section A–A' of drawings in FIGS. 8 and 9 and, in FIG. 11 which is a cross-sectional view of a set of stacked via-studs at section B–B' of drawings in FIGS. 8 and 9.

The foregoing steps form cantilevers in wide metal lines, and respectively connect the formed cantilevers and bulkheads in one level of bus line to bulk heads and cantilevers formed in the bus line of the adjacent levels of interconnection.

The foregoing steps can be repeated to form the redundant stacked via studs of the invention with increased flexibility and, thereby, improved fatigue life.

It should be apparent to those skilled in the art that given the teachings above, other embodiments of designs to reduce the strain in a stacked via-stud, imbedded in a soft media and capped at top and at bottom by relatively denser media; or other modifications of this invention, such as, for example, the cross-sectional area of the via-stud could be enlarged; a set of neighboring dummy studs may be provided; or, a stronger liner for high conductivity metals may be provided without departing from the spirit of the invention. Accordingly, such modifications are considered within the scope of the invention as limited solely by the appended claims.

Having thus described our invention, what we claim as new and desire to secure by Letters Patent is as follows:

1. A method of forming a multilayer semiconductor integrated circuit structure comprising the steps of:

a) forming a first via stud of a stacked via-stud in a first interconnection level connecting a metal feature formed in a semiconductor substrate to a first metal interconnection line segment, said first via-stud and first metal interconnection line formed in a first interconnect dielectric layer including a low-k dielectric material;

b) forming a second interconnection level above said first interconnection level, said second interconnection level comprising a second interconnect dielectric layer including low-k dielectric material and forming therein a second level integrated via-stud in conductive alignment with said first metal interconnection line segment, and a second metal interconnection line segment of rectangular shape at a selected location such that one end of the second metal line segment is above the first metal line segment of the same length and the width;

c) forming a third interconnection level above said second interconnection level, said third interconnection level comprising a dielectric layer including low-k dielectric material and forming therein a third level integrated via-stud connecting said second metal interconnection line segment of rectangular shape at an opposite end thereof with a third metal interconnection line segment, said first, second and third integrated via-studs and said second metal line segment forming a stacked via-stud arrangement in said low-k dielectric layers with said second metal line segment comprising a cantilever structure.

2. The method as claimed in claim 1, wherein a dielectric layer of each said first, second and third interconnection levels includes a soft low-k dielectric material, said cantilever being integrated within said soft low-k dielectric material to increase resistance to thermal fatigue crack formation.

3. The method as claimed in claim 2, wherein said soft low-K dielectric material includes SiLK, Aerogels, fluoridized polyimide, polymeric compound or air.

4. The method as claimed in claim 1, wherein a dielectric layer of said first interconnection level over said substrate includes a dense dielectric material for passivating semiconductor devices and local interconnect devices underneath.

5. The method as claimed in claim 4, wherein said dense dielectric material includes; one of borosilicate glass or boro-phosphosilicate glass (BPSG) borosilicate glass.

6. The method as claimed in claim 1, wherein a dielectric layer of said third interconnection level includes a cap of dense dielectric material including PECVD silicon oxide or polyamide to form a top passivating layer, substantially planar with said third interconnection line segment.

7. The method as claimed in claim 1, wherein said forming steps a), b) and c) include implementing a dual damascene process.

8. The method as claimed in claim 1, wherein said further including forming a fourth level interconnection level above said third interconnection level, said fourth interconnection level comprising a dielectric layer and forming therein a fourth level integrated via-stud and fourth metal interconnection line segment, said third metal line segment comprising a cantilever structure connected to a fourth metal interconnection line segment via said fourth level integrated via-stud.

* * * * *